(12) United States Patent
Chiou et al.

(10) Patent No.: US 6,784,750 B2
(45) Date of Patent: Aug. 31, 2004

(54) TRANSIMPEDANCE AMPLIFIER WITH SELECTIVE DC COMPENSATION

(75) Inventors: Chii-Fa Chiou, Lake Forest, CA (US); Yuji Isobe, Irvine, CA (US); Yuji Yoshida, Irvine, CA (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 10/406,071

(22) Filed: Apr. 2, 2003

(65) Prior Publication Data

US 2003/0218508 A1 Nov. 27, 2003

Related U.S. Application Data

(60) Provisional application No. 60/371,288, filed on Apr. 9, 2002.

(51) Int. Cl.[7] .................................................. H03F 3/08
(52) U.S. Cl. ............................ 330/308; 330/84; 330/69
(58) Field of Search ............................... 330/69, 84, 85, 330/124 R, 136, 308; 250/214 A

(56) References Cited

U.S. PATENT DOCUMENTS

| | | | | |
|---|---|---|---|---|
| 5,347,388 A | * | 9/1994 | Little et al. | 250/214 A X |
| 5,525,929 A | | 6/1996 | Nagahori et al. | 330/110 |
| 5,561,288 A | * | 10/1996 | Stevens | 250/214 A X |
| 5,602,510 A | | 2/1997 | Bayruns et al. | 330/282 |
| 5,606,277 A | | 2/1997 | Feliz | 327/311 |
| 5,606,282 A | | 2/1997 | Yoshida | 330/51 |
| 5,606,288 A | | 2/1997 | Prentice | 330/260 |
| 5,767,538 A | | 6/1998 | Mullins et al. | 257/115 |
| 5,838,731 A | | 11/1998 | Nagahori | 375/289 |
| 5,900,779 A | | 5/1999 | Giacomini | 330/252 |
| 5,982,232 A | | 11/1999 | Rogers | 330/69 |
| 6,028,482 A | | 2/2000 | Herrle | 330/282 |
| 6,057,738 A | | 5/2000 | Ku et al. | 330/308 |
| 6,064,507 A | | 5/2000 | Heflinger et al. | 359/237 |
| 6,069,534 A | | 5/2000 | Kobayashi | 330/308 |
| 6,084,478 A | | 7/2000 | Mayampurath | 330/308 |
| 6,114,686 A | | 9/2000 | Funahashi | 250/214 A |
| 6,114,913 A | | 9/2000 | Entrikin | 330/308 |
| 6,242,732 B1 | | 6/2001 | Rantakari | 250/214 A |
| 6,275,114 B1 | | 8/2001 | Tanji et al. | 330/308 |
| 6,292,033 B1 | | 9/2001 | Enriquez | 327/89 |
| 6,297,701 B1 | | 10/2001 | Visocchi et al. | 330/308 |
| 6,323,734 B1 | | 11/2001 | Henrion et al. | 330/308 |
| 6,353,366 B1 | | 3/2002 | Chan et al. | 330/305 |

* cited by examiner

*Primary Examiner*—Steven J. Mottola
(74) *Attorney, Agent, or Firm*—Knobbe Martens Olson & Bear, LLP

(57) ABSTRACT

A transimpedance amplifier selectively activates DC compensation to optimize a signal-to-noise ratio for an optical receiver. The optical receiver includes a photodiode that converts a light signal to an electrical current signal, and the transimpedance amplifier converts the electrical current signal to a pair of differential voltage signals for further processing. The electrical current signal is provided to the transimpedance amplifier by connecting a cathode of the photodiode to a first input amplifier via a DC blocking capacitor and by directly connecting an anode of the photodiode to a second input amplifier. The transimpedance amplifier includes a DC correction circuit that generates a correction current when an output of the first input amplifier exceeds a predefined threshold. The correction current is added to an input of the second input amplifier to adjust a DC offset at an output of the second input amplifier.

20 Claims, 12 Drawing Sheets

TRANSIMPEDANCE AMPLIFIER WITH SELECTIVE DC COMPENSATION

RELATED APPLICATION

This application claims the benefit of U.S. Provisional Application No. 60/371,288, filed on Apr. 9, 2002, and entitled Pseudo-Differential Transimpedance Amplifier With Fast DC Offset Cancellation.

BACKGROUND OF THE INVENTION

1. Field of the Invention

The present invention relates generally to fiber optic communication devices and more particularly to a transimpedance amplifier in a fiber optic receiver circuit.

2. Description of the Related Art

A fiber optic receiver circuit typically includes a photodiode and a transimpedance amplifier. The photodiode converts a light signal received from a fiber optic cable to an electrical current signal, and the transimpedance amplifier converts the electrical current signal to an electrical voltage signal for further processing. The power of the light signal can vary at an input of the fiber optic receiver circuit. For example, the power of the light signal varies with the distance traveled in the fiber optic cable and the attenuation ratio of the fiber optic cable.

In some applications, the power of the light signal at the input of the fiber optic receiver can range from less than 100 microwatts to over 2 milliwatts. The transfer characteristic of the photodiode is typically 0.75 to 1 watt per ampere. Thus, the electrical current signal generated by the photodiode has a wide range of possible values. The transimpedance amplifier typically requires a wide dynamic range to process the electrical current signal from the photodiode without distortion.

FIG. 1 illustrates a typical fiber optic receiver circuit. The fiber optic receiver circuit includes a single-ended optical detector circuit 100 and a single-ended input transimpedance amplifier 102. The optical detector circuit 100 includes a photodiode 104, a filter capacitor 106, and a bias resistor 108. The bias resistor 108 is coupled between a cathode of the photodiode 104 and a power source (VCC). The filter capacitor 106 is coupled between the cathode of the photodiode 104 and ground. An anode of the photodiode 104 provides a current as a single-ended output of the singled-ended optical detector circuit 100.

A light signal (or a light input) at the input of the fiber optic receiver circuit is unipolar (e.g., has two logical states represented by dark or light). In response to the unipolar light signal, the photodiode 104 generates a unipolar electrical current (Iin) flowing in one direction from the cathode to the anode. The amplitude of the unipolar electrical current is proportional to intensity of the light signal. As the intensity of the light signal changes, the amplitude and average value of the unipolar electrical current also change. The average value or direct current (DC) portion of the unipolar electrical current is provided via the bias resistor 108, and the alternating current (AC) portion of the unipolar electrical current is provided via the filter capacitor 106. The anode of the photodiode 104 is typically connected to a single-ended input of the transimpedance amplifier 102.

The transimpedance amplifier 102 includes a first stage amplifier 110, a second stage amplifier 112, and a feedback resistor 114. The unipolar electrical current is provided to an inverting input of the first stage amplifier 110. A non-inverting input of the first stage amplifier 110 is coupled to ground. The feedback resistor 114 is coupled between the inverting input and an output of the first stage amplifier 110. The output of the first stage amplifier 110 is coupled to a non-inverting input of the second stage amplifier 112. A reference voltage is coupled to an inverting input of the second stage amplifier 112. The second stage amplifier 112 outputs a differential pair of voltages (V+, V−) on a V+ output terminal and a V− output terminal, respectively.

The first stage amplifier 110 uses the feedback resistor 114 to convert the unipolar electrical current (or the input current) to a single-ended voltage. The second stage amplifier 112 uses the reference voltage to convert the single-ended voltage to the differential pair of output voltages (V+, V−), which is the output of the transimpedance amplifier 102.

The single-ended transimpedance amplifier 102 has a limited dynamic range. For example, relatively high input currents can cause circuit saturation in the first stage amplifier 110. The circuit saturation affects timing (e.g., extra delay or jitter at data transitions) and can result in degradation of bit error ratio, which is a measure of the system performance.

Furthermore, varying input currents can cause signal distortion at the output of the second stage amplifier 112. The reference voltage used by the second stage amplifier 112 to convert the single-ended voltage to the differential voltage typically has a fixed level. The level of the reference voltage determines a slice level which differentiates between logic high and logic low. The slice level should be set at approximately 50% of the amplitude (or the DC level) of the single-ended voltage to preserve signal pulse widths (or duty cycle) in the differential voltage. The DC level of the single-ended voltage varies as the amplitude of the input current varies. Thus, the duty cycle (or pulse widths) may be distorted at the output of the transimpedance amplifier 102.

FIG. 2 illustrates another typical fiber optic receiver circuit which is substantially similar to the fiber optic receiver circuit described in FIG. 1 with an additional DC cancellation circuit 200 as part of a transimpedance amplifier 202. The DC cancellation circuit 200 minimizes the signal distortion described above by sensing the DC levels of the differential pair of output voltages (V+, V−) and generating a current sink to remove the DC input current (Iin(DC)) at the input of the transimpedance amplifier 202.

For example, the DC cancellation circuit 200 includes a low pass filter 204, an operational amplifier 206, and a voltage control current source (VCCS) 208. The low pass filter 204 is coupled across the differential output voltage to sense a difference in the DC levels between V+ and V−. The operational amplifier 206 is coupled to an output of the low pass filter 204 and generates a control voltage indicative of the difference in the DC levels between V+ and V−. The VCCS 208 generates a current sink with a level that is determined by the control voltage, and the current sink is coupled to the input of the transimpedance amplifier 202.

The DC cancellation circuit 200 is a feedback loop that typically responds slowly (or requires a long time to settle to a final state) due to bandwidth requirements. Thus, the DC cancellation circuit 200 is not suitable for burst mode data communication. Furthermore, the value of capacitors used in the DC cancellation circuit 200 is relatively large and cannot be efficiently implemented in integrated circuits.

SUMMARY OF THE INVENTION

The present invention solves these and other problems by providing a pseudo-differential transimpedance amplifier which improves dynamic range and minimizes signal distortion. The pseudo-differential transimpedance amplifier can be used in an optical receiver circuit which translates a light signal into an electrical voltage signal. An optical detector first senses the light signal and generates an electrical current signal in response. The pseudo-differential transimpedance amplifier uses a differential configuration to convert the electrical current signal to differential voltage signals. In addition to other benefits, the differential configuration can advantageously double a current-to-voltage conversion gain.

In one embodiment, the pseudo-differential transimpedance amplifier includes a pseudo-differential input stage. For example, the pseudo-differential input stage includes a first input amplifier and a second input amplifier. The first input amplifier is AC-coupled to the optical detector and is configured to convert a first input current to a first output voltage (or a first pseudo-differential voltage). The second input amplifier is DC-coupled to the optical detector and is configured to convert a second input current to a second output voltage (or a second pseudo-differential voltage).

In one embodiment, the first input amplifier is coupled via a capacitor (or AC-coupled) to a cathode of a photodiode in the optical detector. The second input amplifier is directly coupled (or DC-coupled) to an anode of the photodiode in the optical detector. Thus, the first input current has no substantial DC component while the second input current has a DC offset. Furthermore, the first input current and the second input current correspond to opposite polarities of the electrical current signal generated by the photodiode. Accordingly, the polarity of the first output voltage is opposite the polarity of the second output voltage in the pseudo-differential input stage. The first output voltage and the second output voltage can be provided to a differential output stage which generates differential output voltages for the pseudo-differential transimpedance amplifier.

The pseudo-differential transimpedance amplifier can advantageously allow a conventional single-ended system to achieve a differential architecture with minimal modification and without adding extra components. In one embodiment, the pseudo-differential transimpedance amplifier is coupled to a single-ended optical detector which is modified to provide pseudo-differential outputs to the pseudo-differential transimpedance amplifier. A simple modification allows the optical detector to provide an AC-coupled output in addition to a DC-coupled output provided by an anode of a photodiode in the optical detector. For example, the connection of a filter capacitor in the single-ended optical detector can be easily modified to allow the filter capacitor to act as a DC-blocking (or an AC-coupling) capacitor. The capacitor provides the AC-coupled output which is connected to the first input amplifier of the pseudo-differential transimpedance amplifier. The DC-coupled output provided by the anode of the photodiode is connected to the second input amplifier.

In one embodiment, the pseudo-differential transimpedance amplifier further includes a DC compensation circuit which operates to minimize a DC component of the electrical current signal at the DC-coupled input to the pseudo-differential transimpedance amplifier. For example, the DC compensation circuit detects the level (or the amplitude) of the electrical current signal (or the input current) from the optical detector and generates a correction current to remove the DC component at the DC-coupled input of the pseudo-differential transimpedance amplifier. Thus, the DC compensation circuit can facilitate the pseudo-differential transimpedance amplifier to operate in a differential mode (e.g., as if both inputs are AC-coupled to the optical detector) even though only the first input is AC-coupled to the optical detector while the second input is DC-coupled to the optical detector.

In one embodiment, the DC compensation circuit includes a peak-hold circuit and a voltage-to-current converter for automatic and continuous high-speed DC compensation. For example, the peak-hold circuit detects the amplitude of the input current by monitoring the first output voltage produced by the first input amplifier in response to the input current. The first input amplifier is AC-coupled to the optical detector. Therefore, the first output voltage generated by an AC component of the input current from the optical detector has no substantial DC offset, and the amplitude of the input current can be easily derived from the first output voltage. The peak-hold circuit is relatively fast to provide a continually updated output indicative of the input current level.

The output of the peak-hold circuit controls the voltage-to-current converter which generates an output correction current corresponding to a partial or a substantial portion of the DC component of the input current. The output of the voltage-to-current converter is coupled to the DC coupled input of the pseudo-differential transimpedance amplifier and draws current away from the second input amplifier to reduce the DC component of the second input current. Reducing the DC component of the second input current reduces an undesirable DC offset in the second output voltage.

Reducing the DC offset in the second output voltage minimizes variations in the common mode voltage between the first output voltage and the second output voltage for optimal performance as differential signals. The first output voltage and the second output voltage are provided to the differential output stage, which generates differential output voltages for the pseudo-differential transimpedance amplifier. The duty cycle of the differential output voltages, which affects timing accuracy of data transitions, is well maintained by minimizing the difference in DC levels between the first output voltage and the second output voltage.

In one embodiment, the DC compensation circuit is selectively activated to optimize a signal-to-noise ratio (SNR). For example, the DC compensation circuit is selectively inactive or activated in discrete steps to minimize input referred noise (or circuit noise) during relatively low input level signals. In one embodiment, the DC compensation circuit includes an amplitude detection circuit to monitor the amplitude of the first output voltage. The amplitude detection circuit advantageously comprises a comparator with a peak-hold circuit or comprises a comparator with a fast logic level hold circuit.

In particular embodiments, the DC compensation circuit further includes a current generator that provides a correction current when the amplitude detection circuit indicates that the amplitude of the first output voltage exceeds a predetermined threshold. The current generator may be a voltage-controlled-current-source (VCCS), a voltage-controlled resistor, or a current mirror circuit. In one embodiment, the current generator increases the correction current in discrete steps as the amplitude of the first output voltage increases and exceeds corresponding predetermined thresholds.

The DC compensation circuit is a relatively high-speed circuit that allows the pseudo-differential transimpedance amplifier to respond quickly to changes in input current levels. Thus, the pseudo-differential transimpedance amplifier is suitable for burst mode optical communication or high-speed communication systems such as Gigabit Ethernet systems.

DETAILED DESCRIPTION OF THE PREFERRED EMBODIMENTS

Figure 1:
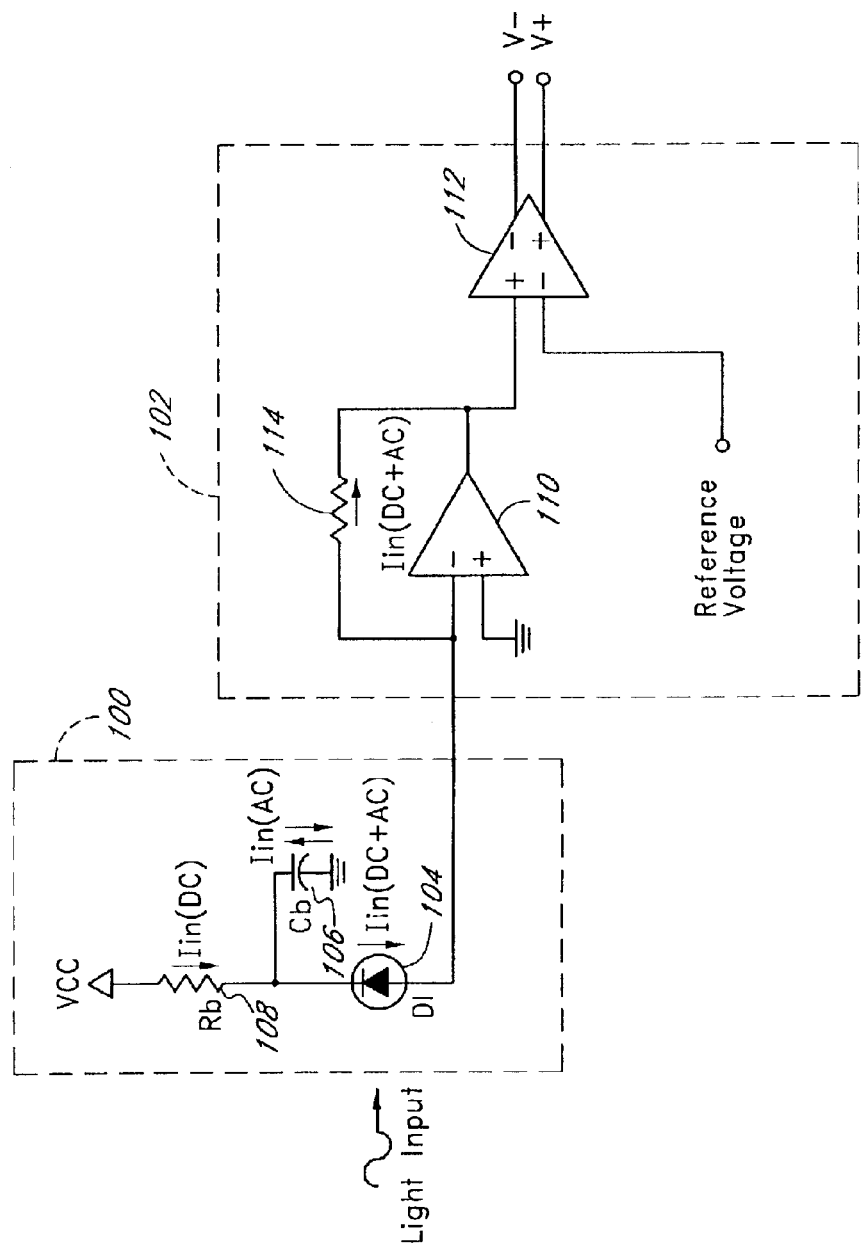
FIG. 1 illustrates a typical fiber optic receiver circuit.
Figure 2:
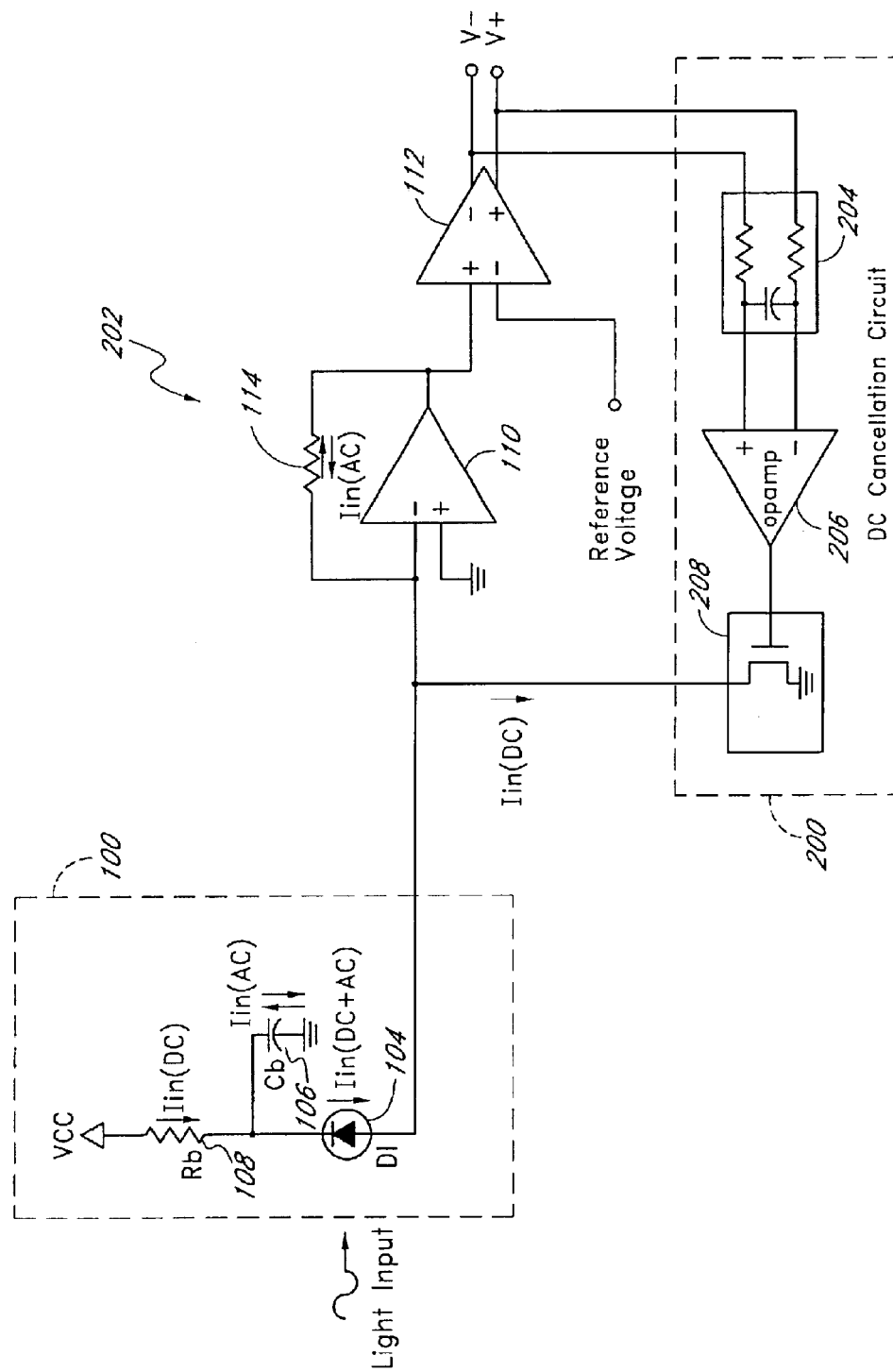
FIG. 2 illustrates a typical fiber optic receiver circuit that includes a DC cancellation circuit.
Figure 3:
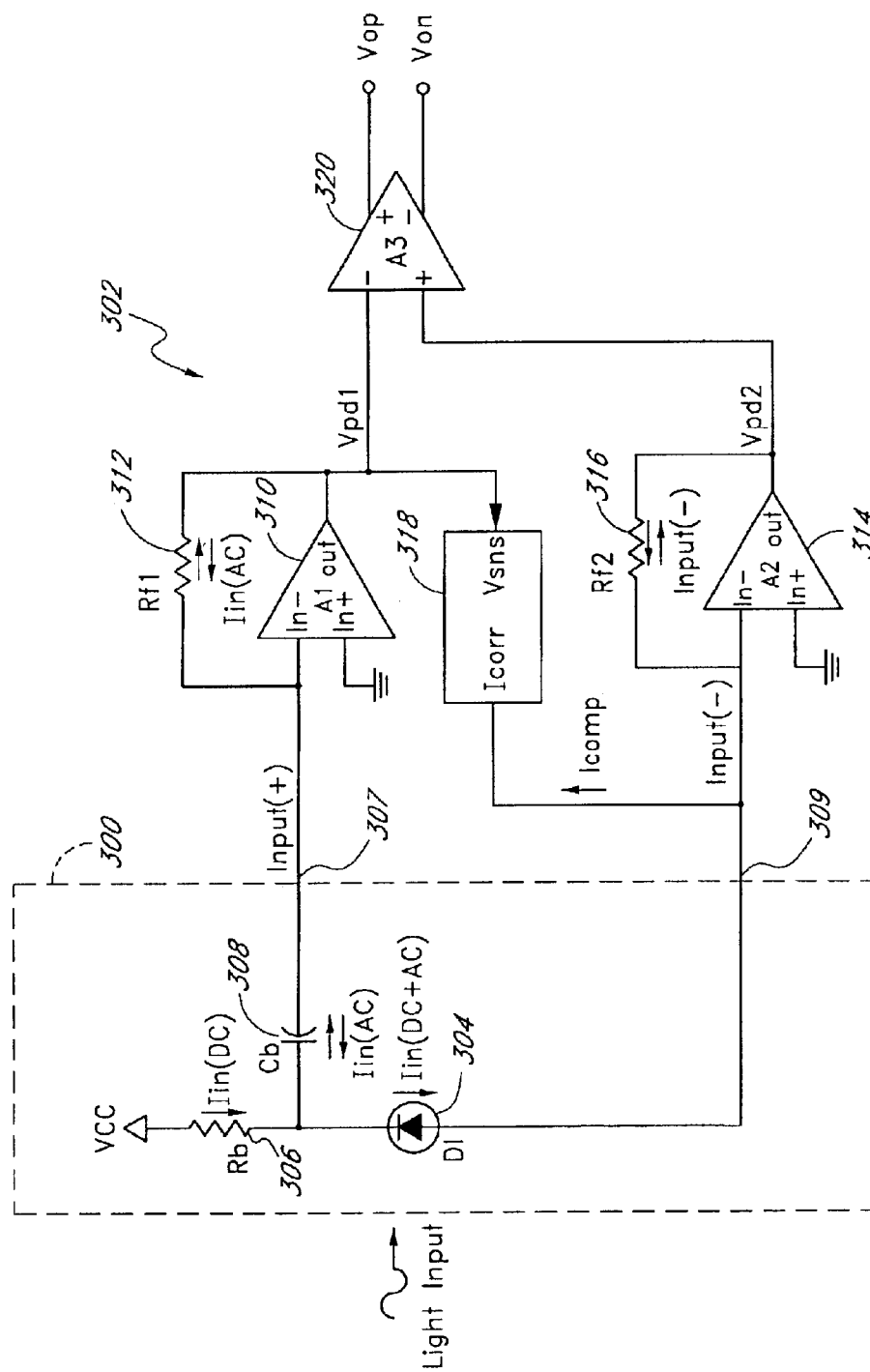
FIG. 3 illustrates one embodiment of a pseudo-differential transimpedance amplifier.

Embodiments of the present invention will be described hereinafter with reference to the drawings. FIG. 3 illustrates one embodiment of a pseudo-differential transimpedance amplifier 302. The pseudo-differential transimpedance amplifier 302 can be used in an optical receiver circuit to provide high-speed conversion of a current signal (Iin) to a differential pair of voltage signals (Vop, Von). In the illustrated embodiment, the pseudo-differential transimpedance amplifier 302 is coupled to an optical detector 300 which generates the current signal (Iin) in response to a light signal received at an input of the optical receiver circuit.

In one, embodiment, the optical detector 300 includes a photodiode (D1) 304, a bias resistor (Rb) 306, and an AC-coupling capacitor (Cb) 308. A cathode of the photodiode 304 is coupled to a power source (VCC) via the bias resistor 306. The AC coupling capacitor 308 is coupled between the cathode of the photodiode 304 and a first output 307 of the optical detector 300. An anode of the photodiode 304 is coupled to a second output 309 of the optical detector 300.

The photodiode 304 generates a unipolar current signal (Iin) in response to a light signal. The amplitude of the unipolar current signal is proportional to the intensity of the light signal. The bias resistor 306 conducts an average level (or a DC component) of the unipolar current signal. The AC-coupling capacitor 308 blocks the DC component of the unipolar current signal to provide a first current signal (Input(+)) of a first polarity at the first output 307 of the optical detector 300. The first current signal is substantially an AC current signal. The anode of the photodiode 304 provides a second current signal (Input(−)) of a second polarity at the second output 309 of the optical detector 300. The second current signal has a DC component in addition to an AC component. The first current signal and the second current signal are pseudo-differential signals at the outputs 307, 309 of the optical detector 300.

In one embodiment, the optical detector 300 is advantageously realized by reconfiguring a single-ended optical detector to provide pseudo-differential outputs. A simple modification allows the single-ended optical detector to provide an AC-coupled output in addition to a DC-coupled output provided by an anode of a photodiode in the single-ended optical detector. For example, the connection of a filter capacitor in the single-ended optical detector is modified to allow the filter capacitor to act as the AC-coupling capacitor 308. Specifically, the filter capacitor is coupled between a cathode of the photodiode and ground in the single-ended optical detector. The ground connection is lifted to allow the filter capacitor to act as the AC-coupling capacitor 308. In combination with the pseudo-differential transimpedance amplifier, a differential architecture is advantageously realized without adding extra components and with minimal modification to a single-ended system. The differential architecture improves dynamic range and minimizes signal distortion.

In one embodiment, the pseudo-differential transimpedance amplifier 302 includes a first input amplifier (A1) 310, a first feedback resistor (Rf1) 312, a second input amplifier (A2) 314, a second feedback resistor (Rf2) 316, a DC compensation circuit 318, and an output amplifier (A3) 320. The first input amplifier 310 and the second input amplifier 314 form a pseudo-differential input stage. The output amplifier 320 forms a differential output stage and outputs the differential pair of voltage signals (Vop, Von). In one embodiment, the pseudo-differential input stage is coupled to pseudo-differential outputs of the optical detector 300 to generate pseudo-differential output voltages (Vpd1, Vpd2) for the differential output stage. The AC common mode voltage at the input of the differential output stage (e.g., variations in summation of the input signals to the differential output stage) is improved (e.g., minimized) by the pseudo-differential architecture.

The first input amplifier 310 is connected to the AC-coupled output 307 of the optical detector 300, and the second input amplifier 314 is connected to the DC-coupled output 309 of the optical detector 300. The AC-coupled output 307 of the optical detector 300 and the DC-coupled output 309 of the optical detector 300 provide current signals of opposite polarities.

The first current signal (Input(+)) is provided to an inverting input terminal (In−) of the first input amplifier 310. A non-inverting input terminal (In+) of the first input amplifier 310 is coupled to ground. The first feedback resistor 312 is coupled between the inverting input terminal and an output terminal (out) of the first input amplifier 310. The first input amplifier 310 and the first feedback resistor 312 convert the first current signal to a first pseudo-differential voltage of a first polarity (Vpd1). The output terminal of the first input amplifier 310 is coupled to an inverting input terminal (−) of the output amplifier 320.

The second current signal (Input(−)) is provided to an inverting input terminal (In−) of the second input amplifier 314. A non-inverting input terminal (In+) of the second input amplifier 314 is coupled to ground. A second feedback resistor 316 is coupled between the inverting input terminal and an output terminal (out) of the second input amplifier 314. The second input amplifier 314 and the second feedback resistor 316 convert the second current signal to a second pseudo-differential voltage of a second polarity (Vpd2). The output terminal of the second input amplifier 314 is coupled to a non-inverting input terminal (+) of the output amplifier 320.

In one embodiment, the DC compensation circuit 318 is coupled between the output terminal of the first input amplifier 310 and the inverting input terminal of the second input amplifier 314. The DC compensation circuit 318 senses the level (or the amplitude) of the electrical current signal (or the input current) from the optical detector 300 and adjusts a DC component of the electrical current signal at the DC-coupled input to the pseudo-differential transimpedance amplifier. In one embodiment, the DC compensation circuit 318 senses the amplitude of the first pseudo-differential voltage (Vpd1) as an indication of the amplitude of the input current and generates a corresponding correction current (Icomp) to cancel a DC portion of the second current signal, which is used to generate the second pseudo-differential voltage. Thus, the correction current adjusts a DC offset in the second pseudo-differential voltage at the output of the second input amplifier 314. Embodiments of DC compensation circuits are described below in connection with FIG. 5 and FIGS. 7–11.

The DC compensation circuit 318 operates to improve the pseudo-differential transimpedance amplifier 302 by minimizing a DC differential (or a DC common mode voltage) between the first and second pseudo-differential voltages provided to the differential output stage. The DC compensation circuit 318 adjusts a DC offset in the second pseudo-differential voltage (Vpd2) to minimize a difference in DC level with respect to the first pseudo-differential voltage (Vpd1). Thus, the DC compensation circuit facilitates the pseudo-differential transimpedance amplifier to operate in a differential mode (e.g., as if both inputs are AC-coupled to the optical detector) even though only the first input is AC-coupled to the optical detector while the second input is DC-coupled to the optical detector.

Figure 4:
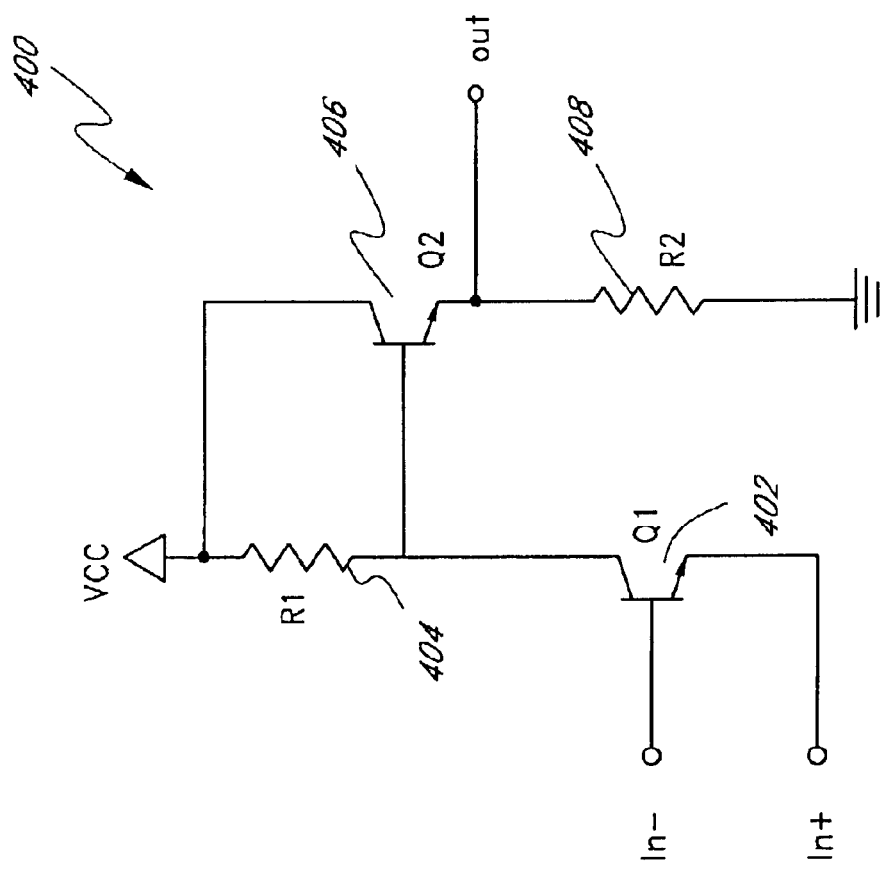
FIG. 4 is a schematic illustration of one embodiment of a high gain amplifier.

FIG. 4 is a schematic illustration of one embodiment of a high gain amplifier 400. The high gain amplifier 400 can be used as the first input amplifier 310 or the second input amplifier 314 shown in FIG. 3. The high gain amplifier 400 includes an input transistor (Q1) 402, a gain resistor (R1) 404, a buffer transistor (Q2) 406, and a bias resistor (R2) 408.

In one embodiment, an emitter terminal of the input transistor 402 is coupled to a non-inverting input (In+) of the high gain amplifier 400. A base terminal of the input transistor 402 is coupled to an inverting input (In−) of the high-gain amplifier 400. A collector terminal of the input transistor 402 is coupled to a power source (VCC) via the gain resistor 404. The input transistor 402 and the gain resistor 404 provide high voltage gain at the collector terminal of the input transistor 402.

The collector terminal of the input transistor 402 is coupled to a base terminal of the buffer transistor 406. A collector terminal of the buffer transistor 406 is coupled to the power source. An emitter terminal of the buffer transistor 406 is coupled to ground via the bias resistor 408. The emitter terminal of the buffer transistor 406 provides an output of the high gain amplifier 400. The buffer transistor 406 and the bias resistor 408 form an emitter follower circuit to improve an output impedance of the high gain amplifier 400.

Figure 5:
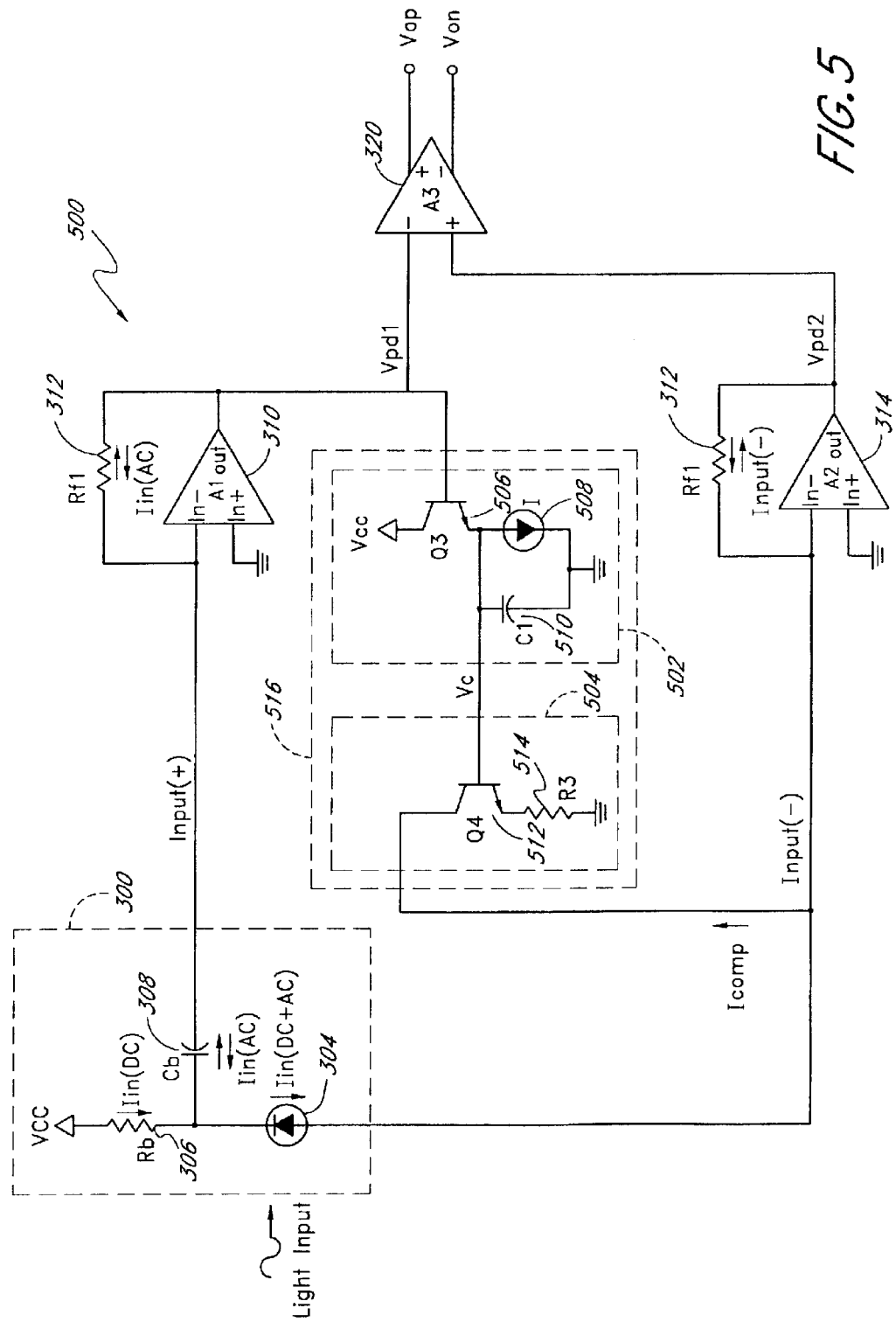
FIG. 5 is a schematic illustration of one embodiment of a pseudo-differential transimpedance amplifier with a DC compensation circuit that provides continuous tracking of amplitude and DC correction.

FIG. 5 is a schematic illustration of one embodiment of a pseudo-differential transimpedance amplifier 500 with an embodiment of a DC compensation circuit 516 that provides automatic and continuous high-speed tracking of a photodetector current and DC correction. The following discussion focuses on the DC compensation circuit 516. The remaining portion of the pseudo-differential transimpedance amplifier 500 in FIG. 5 is substantially similar to the pseudo-differential transimpedance amplifier 302 described in FIG. 3.

In one embodiment, the DC compensation circuit 516 is coupled between an output of the first input amplifier 310 and the inverting input of the second input amplifier 314 in the pseudo-differential transimpedance amplifier 500. The DC compensation circuit 516 detects a DC level of the photodetector current (Iin) by monitoring the first pseudo-differential voltage (Vpd1) at the output of the first input amplifier 310. The DC compensation circuit 516 also generates the correction current (Icomp) to remove at least a significant portion (e.g., 50–100%) of a DC component in the second input current (Input(−)) provided to the second input amplifier 314.

In one embodiment, the DC compensation circuit 516 includes a peak-hold circuit 502 to monitor the first pseudo-differential voltage and a voltage-to-current converter 504 to generate the correction current. The peak-hold circuit 502 detects the DC level of the photodetector current (Iin) by sensing the amplitude of the first pseudo-differential voltage (Vpd1) which is generated by the first input current (Input(+)) provided to the first input amplifier 310. The first input amplifier 310 is AC-coupled to the optical detector 300, and the first input current comprises substantially an AC portion of the photodetector current. Thus, the amplitude and the DC level of the photodetector current are easily derived from the first pseudo-differential voltage.

The peak-hold circuit 502 functions relatively fast to output a continually updated control voltage (Vc) corresponding to a peak amplitude of the first pseudo-differential voltage. The voltage-to-current converter 504 generates the correction current (Icomp) in response to the control voltage to subtract a portion of the DC component in the second input current (Input(−)) provided to the second input amplifier 314. The second input amplifier 314 is DC-coupled to the optical detector 300, and the second input current includes both the AC portion and a DC portion of the photodetector current. Removing a substantial portion of the DC component in the second input current minimizes an undesirable DC offset in a second pseudo-differential voltage (Vpd2) at the output of the second input amplifier 314.

In one embodiment, the peak-hold circuit 502 includes a rectifying transistor (Q3) 506, a bleeding current source (I) 508, and a holding capacitor (C1) 510. The rectifying transistor 506 has a base terminal as an input to the peak-hold circuit 502, a collector terminal coupled to a power source (VCC), and an emitter terminal as an output of the peak-hold circuit 502. The bleeding current source 508 and the holding capacitor 510 are coupled in parallel between the emitter terminal of the rectifying transistor 506 and ground.

The peak-hold circuit 502 tracks the amplitude of the first pseudo-differential voltage (Vpd1) to provide an output indicative of the input current level. For example, the base terminal of the rectifying transistor 506 is coupled to the output of the first input amplifier 310 to monitor the first pseudo-differential voltage. The rectifying transistor 506 allows the positive cycle of the first pseudo-differential voltage to pass through to the holding capacitor 510. The holding capacitor 510 holds the peak amplitude of the first pseudo-differential voltage. The bleeding current source 508 discharges the holding capacitor at a predetermined rate to allow the peak-hold circuit 502 to sense amplitude variations over time. The voltage across the holding capacitor 510 is the control voltage provided to the voltage-to-current converter 504 for generating the correction current.

In one embodiment, the voltage-to-current converter 504 includes a transistor (Q4) 512 and a resistor (R3) 514. The transistor 512 has a base terminal coupled to the output of the peak-hold circuit 502, an emitter terminal coupled to ground via the resistor 514, and a collector terminal coupled to the output of the DC compensation circuit 500. The transistor 512 conducts the correction current based on (or proportional to) the control voltage (or the voltage across the holding capacitor 510). Furthermore, the correction current is inversely proportional to the value of the resistor 514. In one embodiment, the DC offset in the second pseudo-differential voltage at the output of the second input amplifier can be completely canceled by adjusting the value of the resistor 514. Cancellation of the DC offset in the second pseudo-differential voltage minimizes variations in the common mode voltage between the first pseudo-differential voltage and the second pseudo-differential voltage for optimal performance as differential signals.

Figure 6:
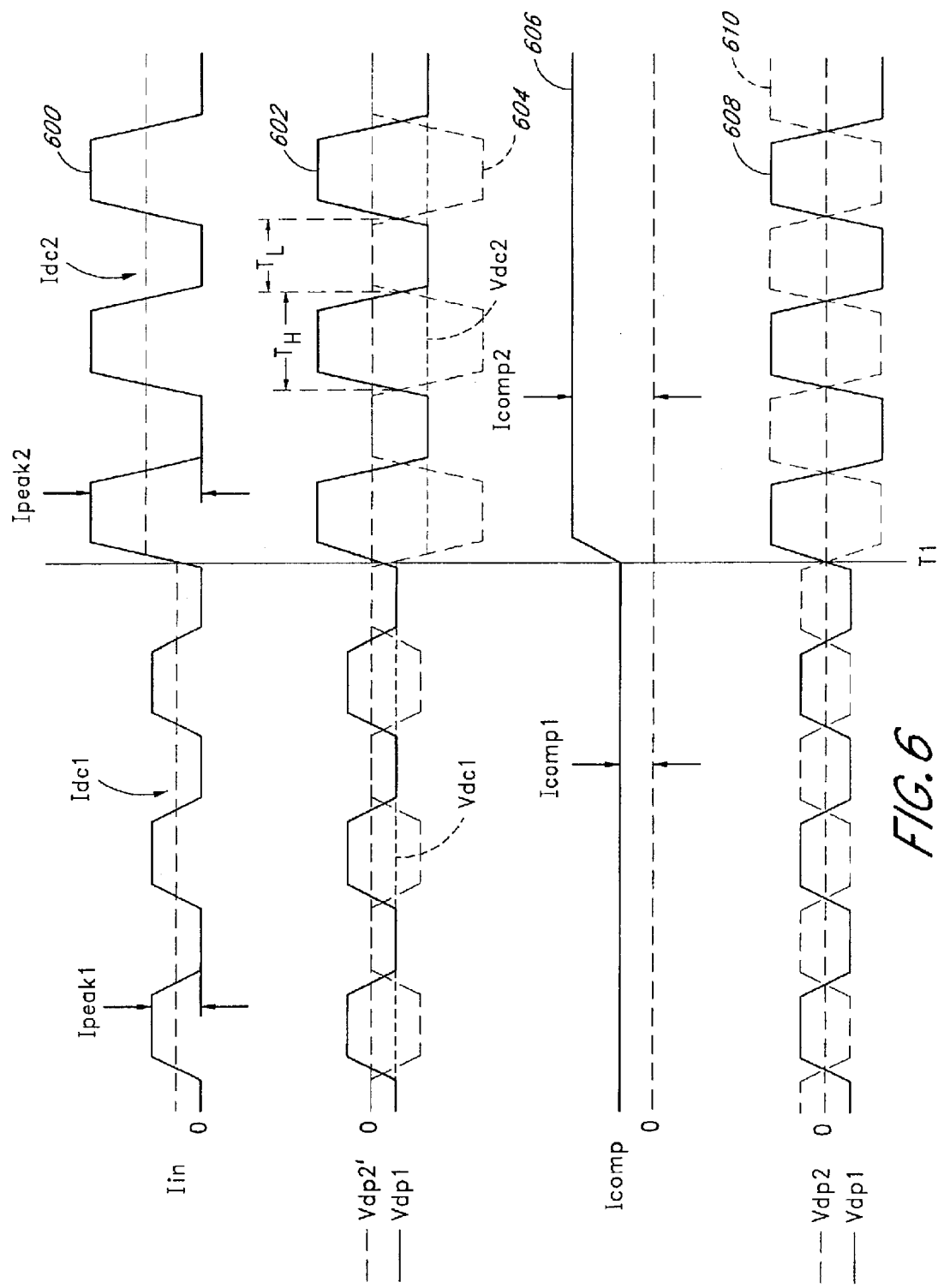
FIG. 6 illustrates waveforms of various signals with respect to time in the pseudo-differential transimpedance amplifier of FIG. 5.

FIG. 6 illustrates waveforms of various signals with respect to time in the pseudo-differential transimpedance amplifier 500 of FIG. 5. A graph 600 represents a unipolar input current signal (Iin) generated by a photodiode 304 in response to a light signal. The amplitude of the unipolar input current signal can vary as the light signal may come from different sources and travel different distances to reach an input of the optical detector 300. For example, the amplitude of the unipolar input current is a first level (Ipeak1) prior to time T1 and a second level (Ipeak2) after time T1. The DC level of the unipolar input current signal varies as the amplitude varies. Thus, the DC level of the unipolar input current signal changes from a relatively low level (Idc1) to a relatively high level (Idc2) at time T1 when the amplitude increases from the first level (Ipeak1) to the second level (Ipeak2).

A first pair of overlaying graphs 602, 604 represents a first pair of pseudo-differential voltages (Vdp1, Vdp2') without DC compensation. The graph 602 represents a first pseudo-differential voltage of a first polarity (Vdp1) at an output of a first input amplifier 310. The graph 604 represents a second pseudo-differential voltage of a second polarity (Vdp2') at an output of a second input amplifier 314 with an assumption that a DC compensation circuit 516 is inactive. The graph 604 shows a DC offset that varies with the amplitude of the second pseudo-differential voltage. For example, the DC offset of the second pseudo-differential voltage in graph 604 changes from a first level (Vdc1) to a second level (Vdc2) at time T1 when the amplitude changes. Furthermore, the pair of overlaying graphs 602, 604 shows an imbalance in the duration ($T_H$) that the pseudo-differential voltages represent logic high and the duration ($T_L$) that the pseudo-differential voltages represent logic low. Thus, the duty cycle of the first pair of pseudo-differential voltages is distorted without DC compensation. The distortion in the duty cycle increases with increasing amplitude of the pseudo-differential voltages. For example, the duty cycle shows more imbalance after time T1 when the amplitude of the pseudo-differential voltages is increased.

A graph 606 represents a correction current (Icomp) which follows the average level of the input current. For example, the correction current increases from a first level (Icomp1) to a second level (Icomp2) at time T1 when the DC level of the input current increases.

A second pair of overlaying graphs 608, 610 represent a second pair of pseudo-differential voltages (Vpd1, Vpd2) with DC compensation. The graph 608 is substantially similar to the graph 602 and represents the first pseudo-differential voltage (Vpd1) at the output of the first input amplifier 310. The graph 610 represents the second pseudo-differential voltage (Vpd2) with the DC compensation circuit 516 active and effectively canceling a substantial portion of the DC component in the second input current provided to the second input amplifier 314. The duty cycle of the second pair of pseudo-differential voltages can be well-maintained due to the DC compensation circuit 516.

Figure 7:
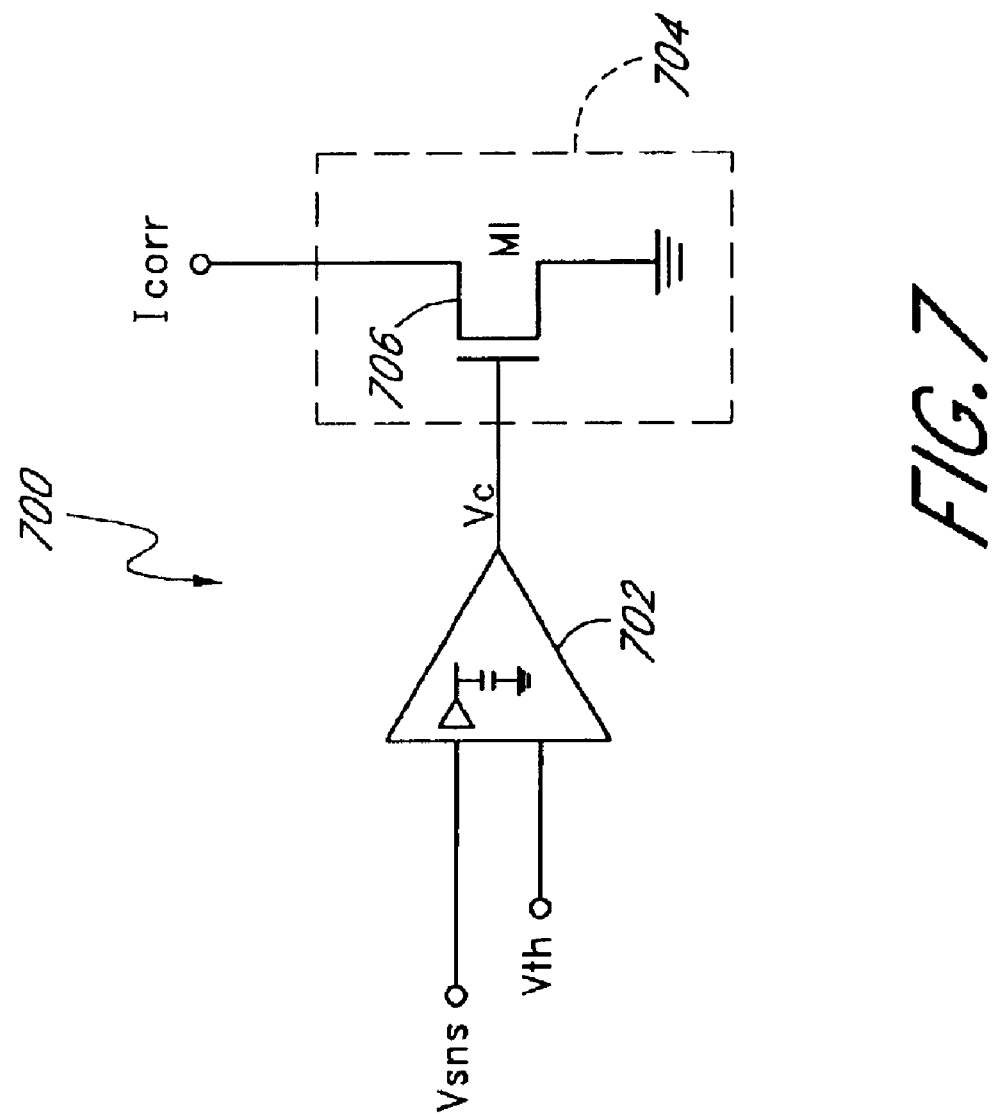
FIG. 7 illustrates one embodiment of a DC compensation circuit that is selectively activated to provide DC cancellation.

FIG. 7 illustrates one embodiment of a DC compensation circuit 700 that can be selectively activated to provide DC cancellation in a pseudo-differential transimpedance amplifier. The DC compensation circuit 700 is activated to provide a correction current when an input current to the pseudo-differential transimpedance amplifier is above a predefined threshold. The DC compensation circuit 700 is inactive for relatively low level input currents to minimize input referred noise and to optimize a signal-to-noise ratio (SNR).

In one embodiment, the DC compensation circuit 700 includes an amplitude detection circuit 702 and a current generator 704. A sensed voltage (Vsns) is provided to a first input of the amplitude detection circuit 702. A predetermined threshold voltage (Vth) is provided to a second input of the amplitude detection circuit 702. An output of the amplitude detection circuit 702 is coupled to the current generator 704. The current generator 704 selectively provides the correction current (Icorr) at an output of the DC compensation circuit 700.

In one embodiment, the sensed voltage is a first pseudo-differential voltage at an output of a first input amplifier (e.g., 310 in FIGS. 3 and 5) in the pseudo-differential transimpedance amplifier. The first input amplifier is AC-coupled to a photodetector (e.g., 304 in FIGS. 3 and 5), and the sensed voltage provides an indication of the input current level. The amplitude detection circuit 702 senses when the sensed voltage is above the predetermined threshold voltage and supplies a control voltage (Vc) to activate the current generator 704. The output of the current generator 704 is coupled to an input of a second input amplifier (e.g., 314 in FIGS. 3 and 5) which is DC-coupled to the photodetector. When the current generator 704 is activated, the current generator 704 outputs the correction current to modify an average level of a second input current provided to the second input amplifier in the pseudo-differential transimpedance amplifier.

In one embodiment, the amplitude detection circuit 702 is a comparator with an internal peak-hold circuit, and the current generator 704 is an output transistor (M1) 706. The output transistor 706 has a gate terminal coupled to an output of the comparator, a source terminal coupled to ground, and a drain terminal coupled to the output of the DC compensation circuit 700. The control voltage at the output of the comparator turns on the output transistor 706 when the amplitude of the sensed voltage exceeds the predetermined threshold voltage.

In one embodiment, the output transistor 706 is a n-type field-effect-transistor (NFET). The output transistor 704 functions as a voltage-controlled-current-source (VCCS) or as a voltage-controlled resistor. The output transistor 706 conducts the correction current (Icorr) from the drain terminal to the source terminal when turned on. The level of the correction current depends on the "on" resistance of the output transistor 706 which is determined by the size of the output transistor 706, the semiconductor process used to fabricate the output transistor 706 and the operating temperature in addition to the control voltage of the comparator. The correction current can cancel at least a portion of a DC component in the second input current provided to a DC-coupled input of the pseudo-differential transimpedance amplifier.

Figure 8:
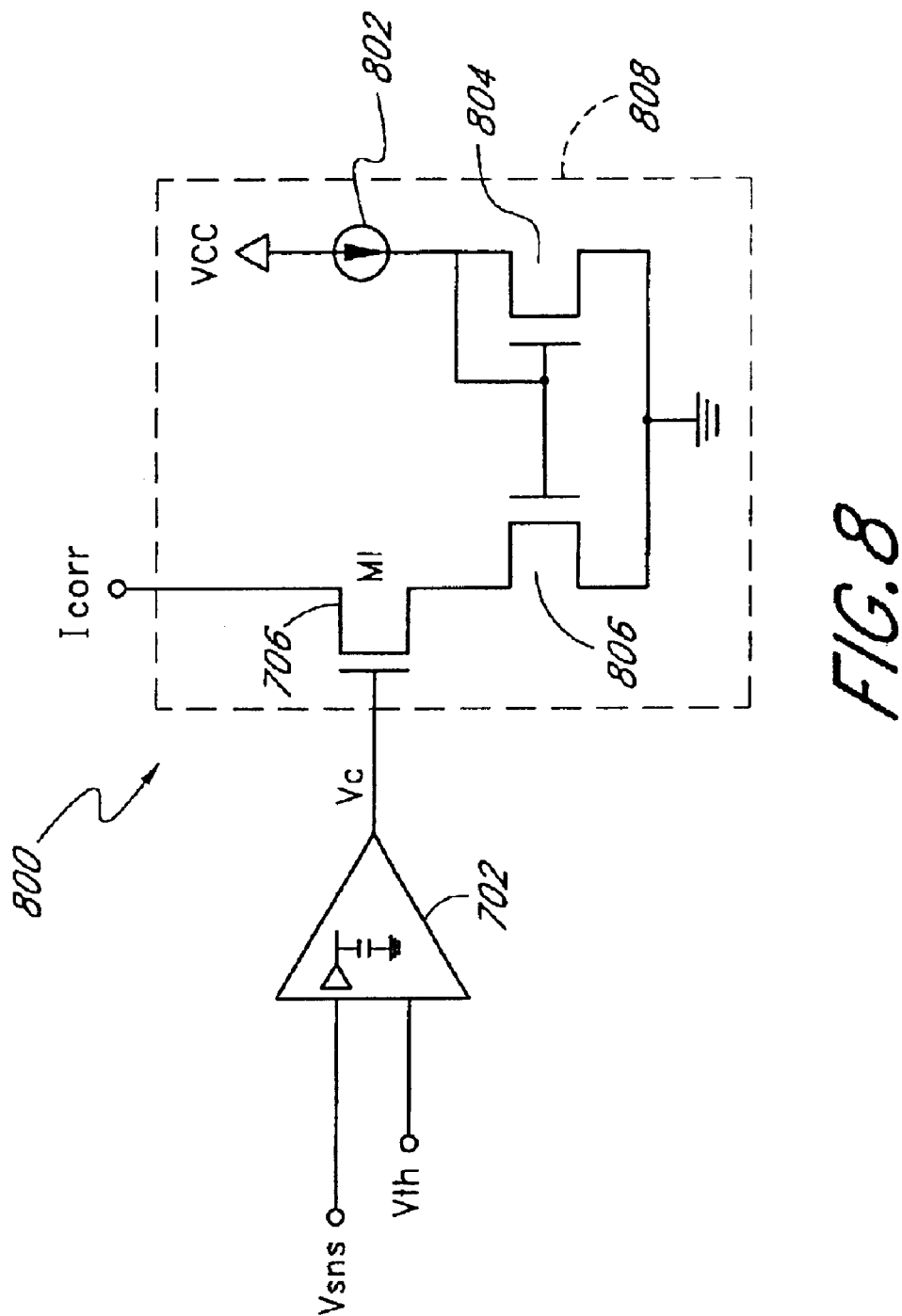
FIG. 8 illustrates an alternate embodiment of a DC compensation circuit with a well-controlled correction current that is selectively activated to provide DC cancellation.

FIG. 8 illustrates an alternate embodiment of a DC compensation circuit 800 with a well-controlled correction current that is selectively activated to provide DC cancellation. The DC compensation circuit 800 is substantially similar to the DC compensation circuit 700 described in FIG. 7 with an additional current mirror circuit coupled between the source terminal of the output transistor 706 and ground in a current generator 808 to provide a relatively stable correction current.

In one embodiment, the current mirror circuit includes a reference current source 802, a transistor 804, and a mirror transistor 806. The transistor 804 and the mirror transistor 806 are NFETs. The reference current source 802 is coupled between a power source (VCC) and a drain terminal of the transistor 804. The transistor 804 is configured to operate as a diode with a gate terminal coupled to the drain terminal and with a source terminal coupled to ground. The mirror transistor 806 has a gate terminal coupled to the gate terminal of the transistor 804, a drain terminal coupled to the source terminal of the output transistor 706, and a source terminal coupled to ground.

The transistor 804 conducts a reference current with a level set by the reference current source 802. In one embodiment, the mirror transistor 806 and the output transistor 704 conduct a correction current (Icorr) that has a similar level as the reference current level. In an alternative embodiment, the mirror transistor 806 and the output transistor 706 are sized to conduct a correction current that is a multiple of the reference current. The reference current can be designed to be relatively independent of process and temperature variations. Accordingly, the correction current is a relatively stable current that substantially independent of process variation, temperature variation, and size of the output transistor 706.

Figure 9:
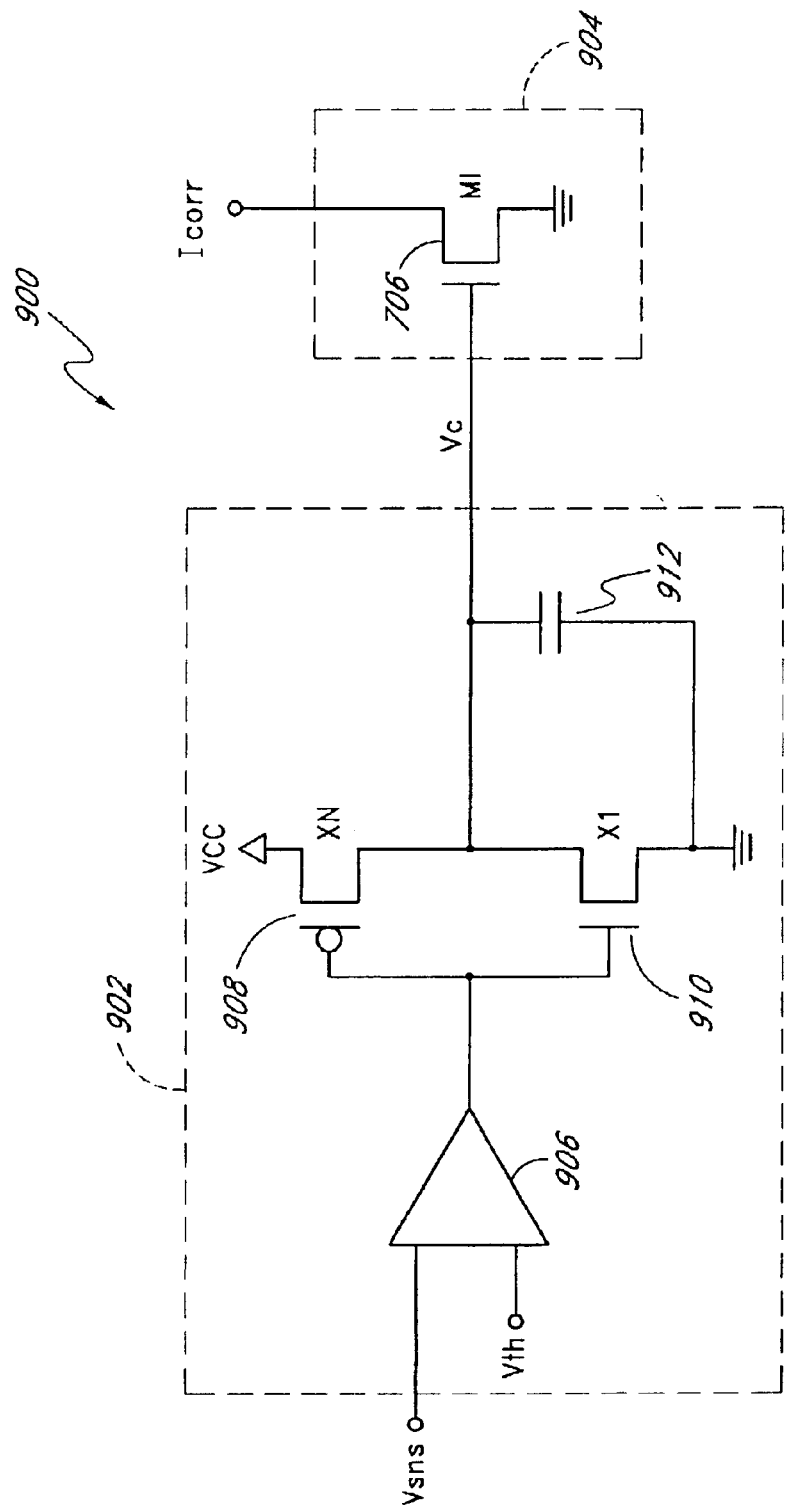
FIG. 9 illustrates another embodiment of a DC compensation circuit that includes a fast logic-level-hold circuit for amplitude detection to selectively activate DC cancellation.

FIG. 9 illustrates another embodiment of a DC compensation circuit 900 that includes a fast logic-level-hold circuit for amplitude detection to selectively activate DC cancellation in a pseudo-differential transimpedance amplifier. The DC compensation circuit 900 includes an amplitude detection circuit 902 and a current generator 904. The amplitude detection circuit 902 generates a control voltage (Vc) to selectively turn on the current generator 904 when an input current to the pseudo-differential transimpedance amplifier exceeds a predetermined threshold. When the current generator 904 is turned on, the current generator 904 provides a correction current to cancel at least a portion of a DC current at a DC-coupled input of the pseudo-differential transimpedance amplifier. The current generator 904 is substantially similar to the current generator 704 described above.

In one embodiment, the amplitude detection circuit 902 includes a comparator 906, a charging transistor 908, a discharging transistor 910, and a holding capacitor 912. The charging transistor 908, the discharging transistor 910, and the holding capacitor 912 comprise a fast logic-level-hold circuit. A sensed voltage (Vsns) and a threshold voltage (Vth) are provided to respective inputs of the comparator 906. An output of the comparator 906 is coupled to gate terminals of the charging transistor 908 and the discharging transistor 910. The charging transistor 908 is a p-type FET with a source terminal coupled to a power source (VCC) and a drain terminal coupled to an output of the amplitude detection circuit 902. The discharging transistor 910 is a NFET with a source terminal coupled to ground and a drain terminal coupled to the output of the amplitude detection circuit 902. The holding capacitor 912 is coupled between the output of the amplitude detection circuit 902 and ground.

In one embodiment, the sensed voltage (Vsns) is derived from an output of an AC-coupled first stage amplifier and provides an indication of the input current level. The sensed voltage is substantially an AC signal. When the sensed voltage is above the threshold voltage, the comparator 906 outputs a relatively low signal to activate the charging transistor 908 to charge the holding capacitor 912. When the sensed voltage is below the threshold voltage, the comparator outputs a relatively high signal to activate the discharging transistor 910 to bleed the holding capacitor 912.

The geometry of the charging transistor 908 is relatively large (XN) so that the holding capacitor 912 can charge relatively quickly when the sensed voltage is above the threshold voltage. The discharging transistor 910 operates in a similar manner as the bleeding current source 508 described in FIG. 5. Thus, the geometry of the discharging transistor 910 is relatively small (X1) to allow the holding capacitor 912 to discharge relatively slowly and to indicate subsequent decreases in amplitude of the sensed voltage.

A voltage across the holding capacitor 912 provides the control voltage (Vc) to selectively activate the current generator 904 to generate the correction current for DC cancellation. When the amplitude of the sensed voltage is less than the threshold voltage, the charging transistor 908 is inactive, and the voltage across the holding capacitor 912 is substantially zero. Thus, no DC cancellation is provided when the amplitude of the sensed voltage is relatively small.

Figure 10:
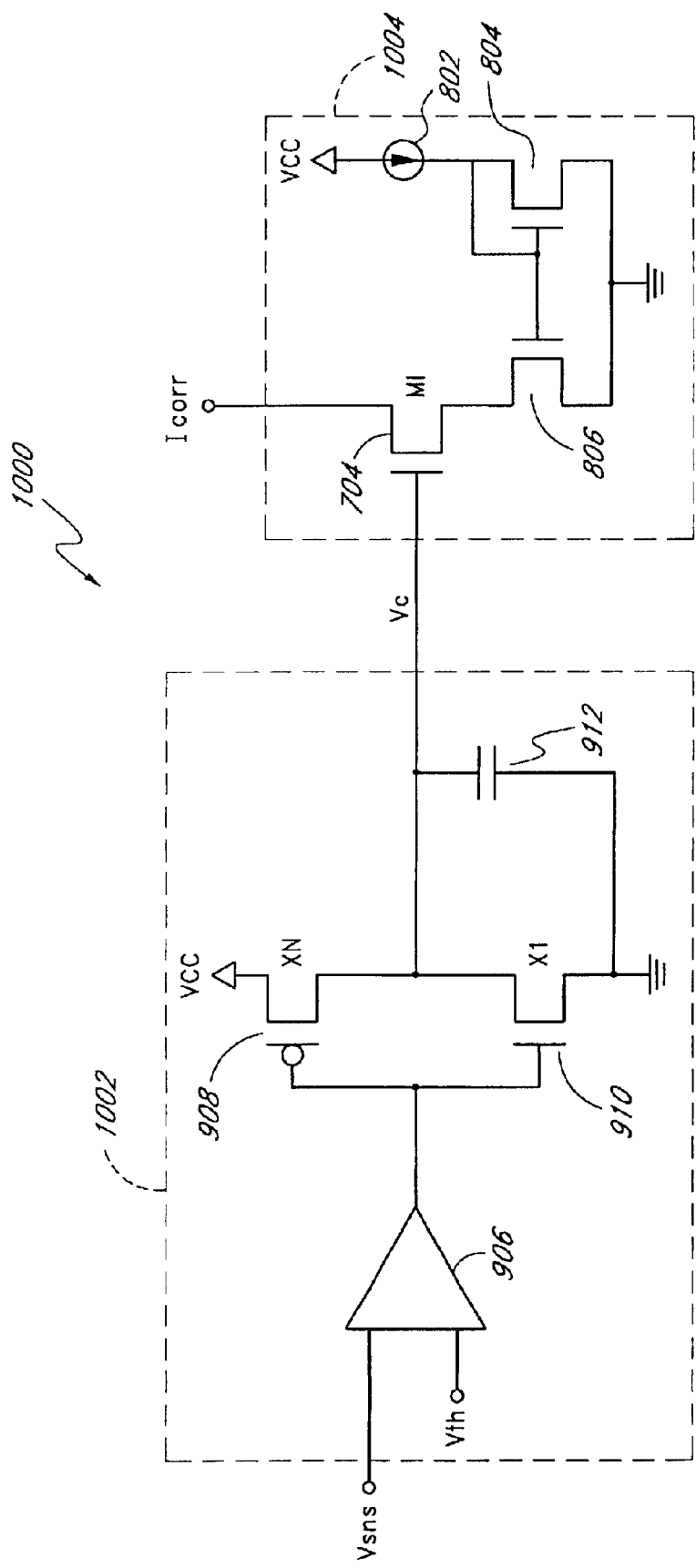
FIG. 10 illustrates another embodiment of a DC compensation circuit that is selectively activated to provide DC cancellation.

FIG. 10 illustrates another embodiment of a DC compensation circuit 1000 that is selectively activated to provide DC cancellation. The DC compensation circuit includes an amplitude detection circuit 1002 and a current generator 1004. The amplitude detection 1002 is substantially similar to the amplitude detection circuit 902 described above. The current generator 1004 is substantially similar to the current generator 804 described above.

Figure 11A:
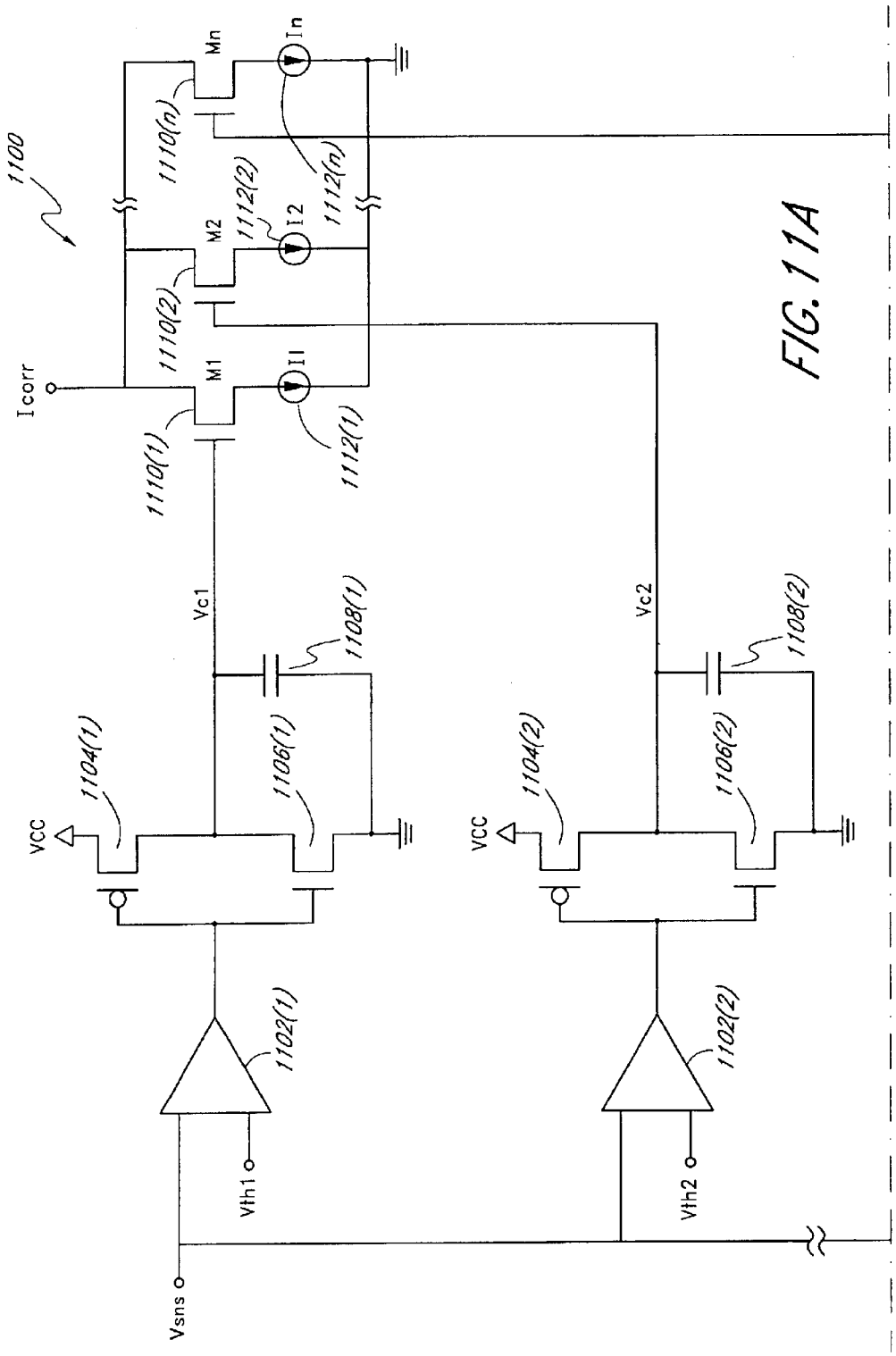
FIG. 11, comprising of FIGS. 11A and 11B, illustrates one embodiment a DC compensation circuit that is selectively activated in multiple levels to provide DC cancellation in discrete steps.
Figures 11, 11B:
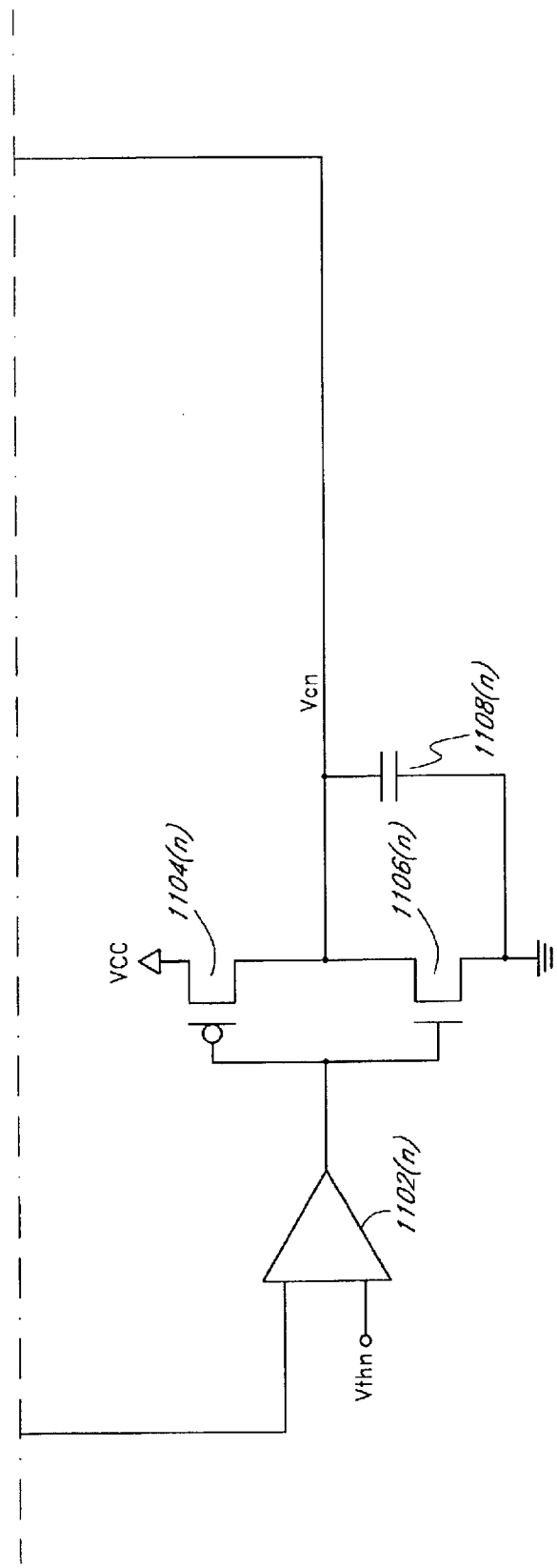

FIG. 11, comprising of FIGS. 11A and 11B, illustrates one embodiment a DC compensation circuit 1100 that is selectively activated in multiple levels to provide DC cancellation in discrete steps. For example, a sensed voltage (Vsns) indicative of input current is provided to an amplitude detection circuit for comparison with n threshold voltages (Vth1–Vthn) to generate n respective control voltages (Vc1–Vcn). The control voltages selectively activate n respective current generators to provide DC cancellation. The outputs of the current generators are commonly connected to provide a correction current (Icorr) which can be increased in discrete steps as the sensed voltage exceeds different threshold voltage levels.

In one embodiment, the amplitude detection circuit includes a plurality of comparators shown as comparators 1102(1)–1102(n) (collectively the comparators 1102) to compare the sensed voltage with the respective threshold voltages. A plurality of fast logic-level-hold circuits are coupled to respective outputs of the comparators 1102 to generate the control voltages. The fast logic-level-hold circuits include charging transistors shown as charging transistors 1104(1)–1104(n) (collectively the charging transistors 1104), discharging transistors shown as discharging transistors 1106(1)–1106(n) (collectively the discharging transistors 1106), and holding capacitors shown as holding capacitors 1108(1)–1108(n) (collectively the holding capacitors 1108). The charging transistors 1104, the discharging transistors 1106, and the holding capacitors 1108 are connected and function in a similar manner as the fast logic-level-hold circuit described above in FIG. 9.

In one embodiment, the current generators include n output transistors shown as output transistors 1110(1)–1110(n) (collectively the output transistors 1110). The output transistors 1110 are coupled in parallel with gate terminals coupled to the respective control voltages. For example, the output transistors 1110 are NFETs with drain terminals commonly connected to provide the correction current. The source terminals of the output transistors 1110 can also be commonly connected and coupled to ground. Alternatively, n current sources shown as current sources 1112(1)–1112(n) are inserted between the respective source terminals and ground to improve the accuracy of currents conducted by the output transistors 1110. The output transistors 1110 are selectively turned on by the control voltages to increase the correction current in discrete amounts.

The presently disclosed embodiments are to be considered in all respect as illustrative and not restrictive. The scope of the invention being indicated by the append claims, rather than the foregoing description, and all changes which comes within the meaning and ranges of equivalency of the claims are therefore, intended to be embrace therein.

What is claimed is:

1. A pseudo-differential transimpedance amplifier with selective DC compensation, the pseudo-differential transimpedance amplifier comprising:
   a first input amplifier configured to convert a first polarity of an input current to a first voltage;
   a second input amplifier configured to convert a second polarity of the input current to a second voltage; and
   a DC compensation circuit configured to adjust a DC level of the second voltage when the amplitude of the input current exceeds a predetermined threshold.

2. The pseudo-differential transimpedance amplifier of claim 1, wherein the first input amplifier is AC-coupled to an optical detector, and the second input amplifier is DC-coupled to the optical detector.

3. The pseudo-differential transimpedance amplifier of claim 2, wherein the first input amplifier is coupled via a capacitor to a cathode of a photodiode in the optical detector, and the second input amplifier is coupled to an anode of the photodiode.

4. The pseudo-differential transimpedance amplifier of claim 1, wherein the amplitude of the input current is detected indirectly by monitoring the first voltage, and wherein the DC level of the second voltage is adjusted by adding a compensation current to an input of the second input amplifier.

5. The pseudo-differential transimpedance amplifier of claim 4, wherein the DC compensation circuit comprises:
   an amplitude detection circuit coupled to an output of the first input amplifier and configured to output a control voltage indicating when the first voltage exceeds a predefined threshold voltage; and
   a current generator coupled to an output of the amplitude detection circuit and configured to generate the compensation current in response to the control voltage.

6. The pseudo-differential transimpedance amplifier of claim 5, wherein the amplitude detection circuit is a comparator with an internal peak-hold circuit.

7. The pseudo-differential transimpedance amplifier of claim 5, wherein the amplitude detection circuit is a comparator coupled to a logic-level-hold circuit.

8. The pseudo-differential transimpedance amplifier of claim 5, wherein the current generator is a voltage-controlled current source.

9. The pseudo-differential transimpedance amplifier of claim 5, wherein the current generator is a voltage-controlled resistor.

10. The pseudo-differential transimpedance amplifier of claim 5, wherein the current generator is a current mirror circuit.

11. An optical receiver comprising:
    a photo detector that generates an input current in response to a light signal;
    a first amplifier that converts a first polarity of the input current to a first voltage;
    a second amplifier that converts a second polarity of the input current to a second voltage; and
    a compensation circuit that generates a correction current when the first voltage is above a predetermined threshold voltage, wherein the correction current is added to an input of the second amplifier to adjust a DC level of the second voltage.

12. The optical receiver of claim 11, wherein the first amplifier is AC-coupled to the photo detector and the second amplifier is DC-coupled to the photo detector.

13. The optical receiver of claim 11, wherein the compensation circuit further comprises:
    an amplitude detection circuit coupled to an output of the first amplifier and configured to provide a control voltage when the first voltage is above the predetermined threshold voltage; and
    a current generator coupled to an output of the amplitude detection circuit and configured to provide the correction current to the input of the second amplifier in response to the control voltage.

14. A pseudo-differential transimpedance amplifier comprising:
    a first input amplifier configured to receive an AC-coupled input current and to output a first voltage;
    a second input amplifier configured to receive a DC-coupled input current and to output a second voltage; and
    a DC compensation circuit coupled between an output of the first input amplifier and an input of the second input amplifier to selectively adjust a DC offset in the second voltage.

15. The pseudo-differential transimpedance amplifier of claim 14, wherein the DC compensation circuit generates a correction current for the input of the second input amplifier when the first voltage exceeds a predefined voltage threshold.

16. The pseudo-differential transimpedance amplifier of claim 15, wherein the correction current increases in discrete steps as the first voltage exceeds different voltage thresholds.

17. A method for selectively adjusting a DC offset in a pair of differential signals, the method comprising the acts of:
    providing a first input signal of a first polarity to a first amplifier to generate a first output voltage;
    providing a second input signal of a second polarity to a second amplifier to generate a second output voltage;
    detecting the amplitude of the first output voltage;
    generating a correction current if the amplitude of the first output voltage exceeds a predetermined threshold; and combining the correction current with the second input signal at an input of the second amplifier to adjust the DC offset of the second output voltage.

18. The method of claim 17, wherein the first input signal and the second input signal are generated by a photodiode in response to a light signal.

19. A transimpedance amplifier comprising:

means for converting an AC-coupled current signal to a first voltage;

means for converting a DC-coupled current signal to a second voltage;

means for generating a compensation current when the first voltage exceeds a predefined threshold; and means for adding the compensation current to the DC-coupled current signal to adjust a DC offset in the second voltage.

20. The transimpedance amplifier of claim 19, wherein the AC-coupled current signal and the DC-coupled current signal are of opposite polarities.

* * * * *